United States Patent [19]
Goossen et al.

[11] Patent Number: 6,159,760
[45] Date of Patent: Dec. 12, 2000

[54] METHOD OF FABRICATING OXIDE-APERTURE VERTICAL CAVITY SURFACE EMITTING LASERS

[75] Inventors: Keith Wayne Goossen, Aberdeen; Martin C. Nuss, Fair Haven, both of N.J.

[73] Assignee: Lucent Technologies Inc., Murray Hill, N.J.

[21] Appl. No.: 09/301,843

[22] Filed: Apr. 29, 1999

[51] Int. Cl.[7] .................................................. H01L 21/00
[52] U.S. Cl. ........................ 438/34; 438/23; 438/33; 438/39; 438/46
[58] Field of Search ............................... 438/22, 23, 34, 438/33, 39, 46

[56] References Cited

U.S. PATENT DOCUMENTS

| | | | |
|---|---|---|---|
| 5,757,830 | 5/1998 | Liau et al. | 372/36 |
| 5,881,085 | 3/1999 | Jewell | 372/46 |
| 5,936,266 | 8/1999 | Holonyak, Jr. et al. | 257/106 |
| 6,054,335 | 4/2000 | Sun et al. | 438/235 |

OTHER PUBLICATIONS

K. D. Choquette et al., "Vertical–Cavity Surface–Emitting Laser Diodes Fabricated by In Situ Dry Etching and Molecular Beam Epitaxial Regrowth," *IEEE Photonics Technology Letters*, vol. 5, No. 3, pp. 284–287 (1993).

D. L. Huffaker et al., "Sub–40 µA Continuous–Wave Lasing in an Oxidized Vertical–Cavity Surface–Emitting Laser with Dielectric Mirrors", *IEEE Photonics Technology Letters*, vol. 8, No. 8, pp. 974–976 (Aug. 1996).

*Primary Examiner*—Long Pham
*Attorney, Agent, or Firm*—Jeffery J. Brosemer

[57] ABSTRACT

A method of fabricating oxide-apertured vertical cavity surface emitting lasers involving the steps of: i) defining, during the fabrication of one or more VCSELs on an electronic chip, a number of mesa structures of different sizes; ii) selectively oxidizing the chip and mesa structures to produce an oxide-aperture for each structure; iii) inspecting the chip to determine which one of the mesas is desired or optimal; iv) choosing an appropriate metalization mask that serves to metalize and electrically connect only that desired mesa structure; and v) depositing, a dielectric top mirror on that electrically connected mesa. Advantageously, the method may be practiced using a variety of fabrication techniques and apparatus that are compatible with conventional devices. A distinguishing characteristic of our inventive method, is that only a desired or optimal mesa is completed while the remaining mesas on a particular chip remain unprocessed.

3 Claims, 6 Drawing Sheets

PROCESS FLOW

200

300

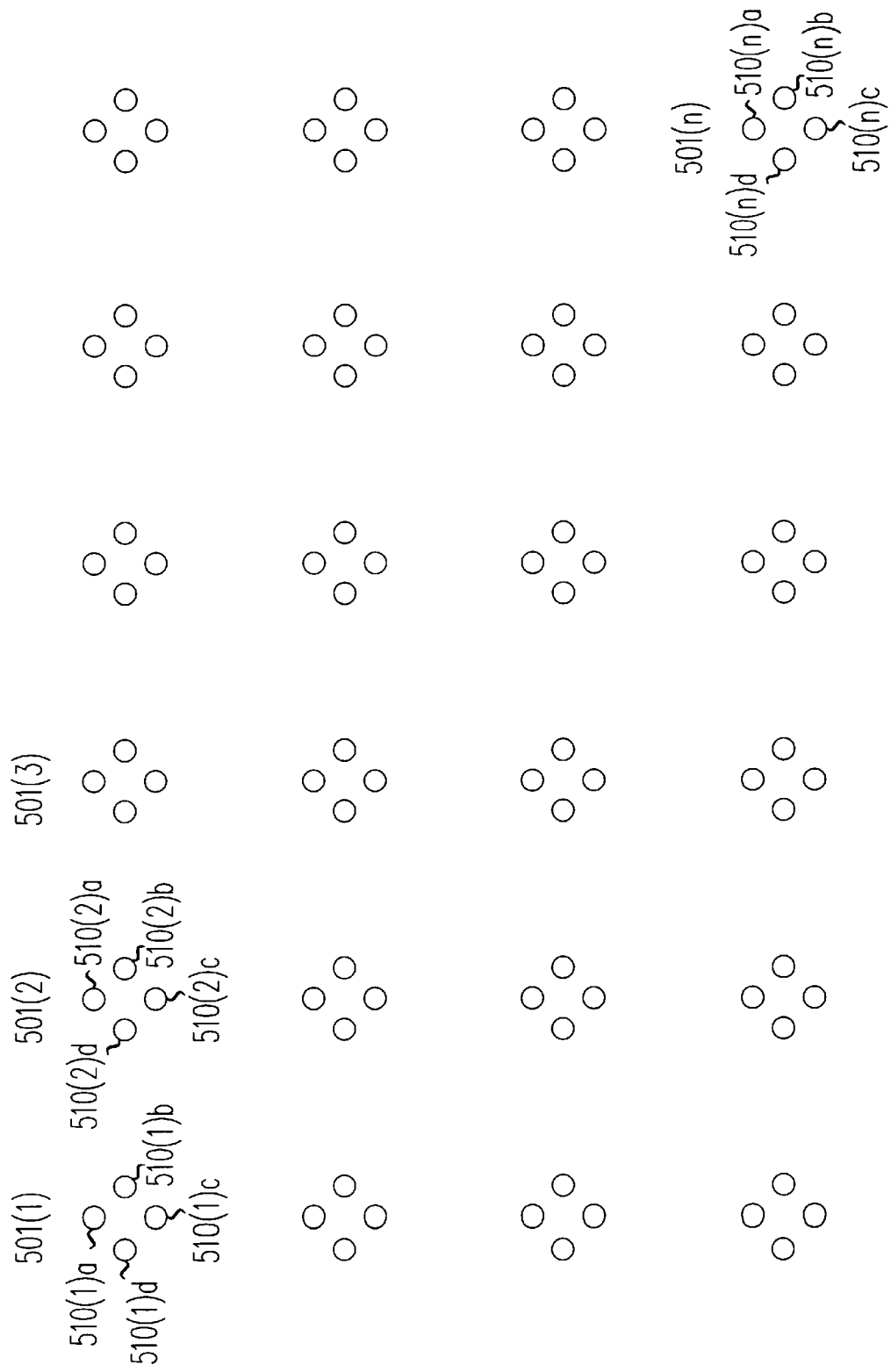

METHOD OF FABRICATING OXIDE-APERTURE VERTICAL CAVITY SURFACE EMITTING LASERS

FIELD OF THE INVENTION

This invention relates to semiconductor lasers and in particular to a method of fabricating oxide-aperture vertical-cavity surface-emitting lasers ("VCSELs").

BACKGROUND OF THE INVENTION

Semiconductor lasers are attractive for a wide variety of applications including telecommunications, computing systems, optical recording systems and optical interconnection of integrated circuits. Semiconductor lasers provide compact sources of coherent, monochromatic light which can be modulated at high bit rates to transmit large amounts of information.

Vertical-cavity surface emitting lasers are particularly promising for applications requiring low cost lasers. As contrasted with edge emitting lasers which emit light parallel to the semiconductor growth planes of their substrates, VCSELs emit light perpendicular to growth planes. A typical VCSEL comprises an active semiconductor region sandwiched between a pair of distributed Bragg reflectors. Upon injection of suitable current through the active region, laser light is transmitted perpendicular to the growth planes.

In a paper entitled "Vertical-Cavity Surface-Emitting Laser Diodes Fabricated by In Situ Dry Etching and Molecular Beam Epitaxial Regrowth" authored by Kent D. Choquette et al and published in *IEEE Photonics Technology Letters*, Vol.5, No. 3, pp. 284–287, a method was described for fabricating lasers having mesa-type structures.

Oxide-apertured VCSELs are fabricated by lateral oxidation of an AlGaAs layer in the current path that, when sized properly, constricts the current by a desired amount. Many references to this method are available such as one authored by D. L. Huffaker, L. A. Graham, H. Deng, and D. G. Deppe entitled "Sub-40 $\mu$A Continuous-Wave Lasing in an Oxidized Vertical-Cavity Surface-Emitting Laser with Dielectric Mirrors", that appeared in IEEE Photonics Technology Letters, Vol. 8, No. 8, August 1996 and is incorporated herein by reference.

One problem with this and similar methods however, is that the rate of oxidation is variable and generally considered uncontrollable to a desired amount. In view of this, it will be apparent that methods for enhancing the manufacture of oxide-apertured VCSELs are highly desirable. We disclose herein such a method.

SUMMARY OF THE INVENTION

We have developed a method of fabricating oxide-apertired vertical-cavity surface-emitting lasers. Specifically, the method involves the steps of: i) defining, during the fabrication of one or more VCSELs on an electronic chip, a member of mesa structures of different sizes; ii) selectively oxidizing the chip and mesa structures to produce an oxide-aperture for each structure; iii) inspecting the chip to determine which one of the mesas is desired or optimal; iv) choosing an appropriate metalization mask that serves to metalize and electrically connect only that desired mesa structure; and v) depositing, a dielectric top mirror on that electrically connected mesa. Advantageously, the method may be practiced using a variety of fabrication techniques and apparatus that are compatible with conventional devices. A distinguishing characteristic of our inventive method, is that only a desired or optimal mesa is completed while the remaining mesas on a particular chip remain unprocessed.

Further features and advantages of the present invention, as well as the structure and operation of various embodiments of the present invention are described in detail below with reference to the accompanying drawing.

BRIEF DESCRIPTION OF THE DRAWING

FIG. 5 is a top view of a VCSEL wafer constructed according to the present invention including sets of varying sized oxidation mesas repeated at a single chip spacing along the wafer;

DETAILED DESCRIPTION OF THE INVENTION

Figure 1:
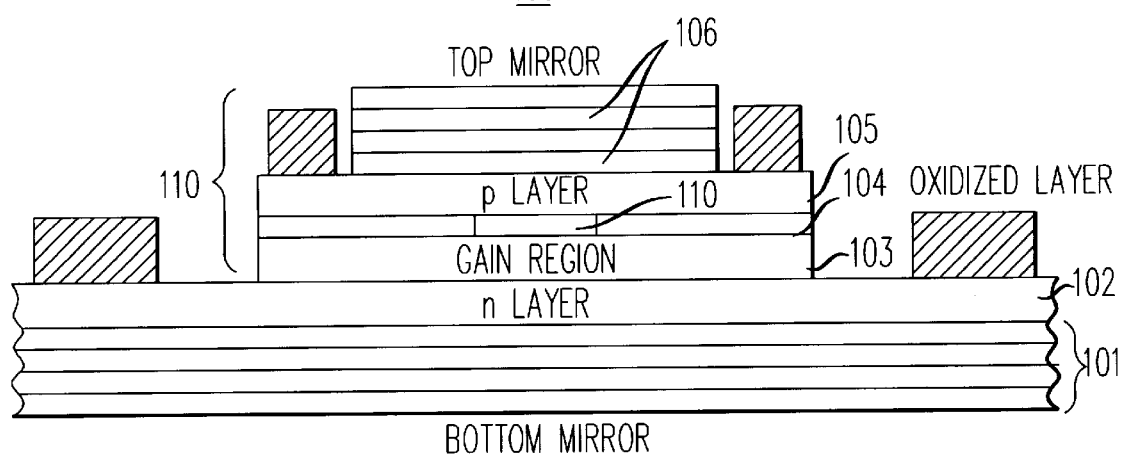
FIG. 1 is cross sectional diagram of an oxide-apertured vertical-cavity surface-emitting laser.

Shown in FIG. 1 is a cross-sectional diagram of a oxide-apertured vertical-cavity surface-emitting laser 100. As shown therein, a substrate 102 supports a mesa structure 110 further comprising a gain region 103, overlying the substrate 102. Disposed upon the gain region 103 is an oxidized layer 104 which defines an aperture 110 that provides a conduit between the gain region 103 and a p-layer 105 that overlies the oxidized layer 104. Overlying and underlying the mesa and substrate respectively, are top mirror 106 and bottom mirror 101.

Figure 2:
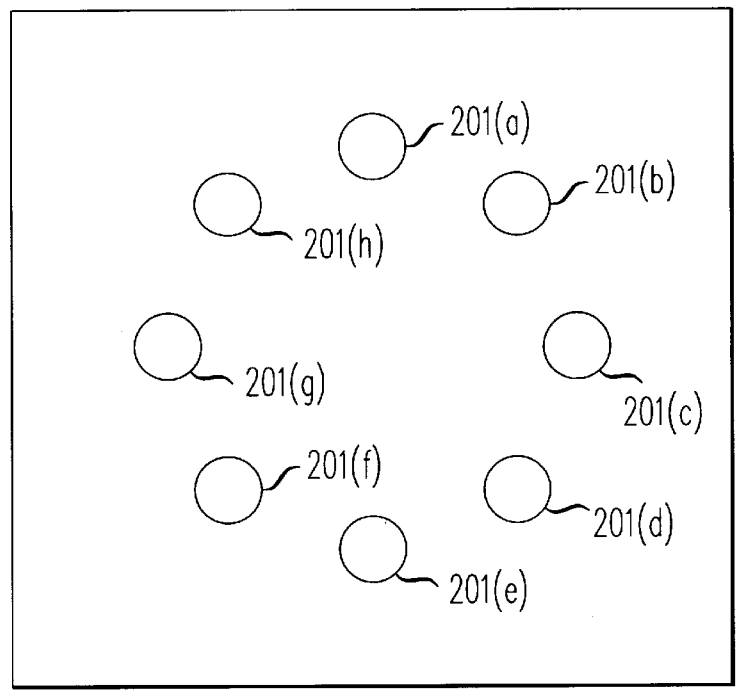
FIG. 2 is a top view of a VCSEL chip constructed according to the present invention including multiple devices with different sized oxide layer mesas.

Commonly, structures such as the oxide-apertured vertical cavity surface emitting laser 100 are formed on semiconductive wafers. Present techniques for wafer processing permit the formation of multiple, individual "chips" on a single wafer. Furthermore, individual chips may contain multiple, individual structures. With reference now to FIG. 2, there is illustrated a chip having multiple devices with different sized oxide layer mesas. Specifically, chip 200 is shown having 8 devices (201(*a*)–201(*h*)) each having a different sized oxidelayer mesa.

Figure 4:
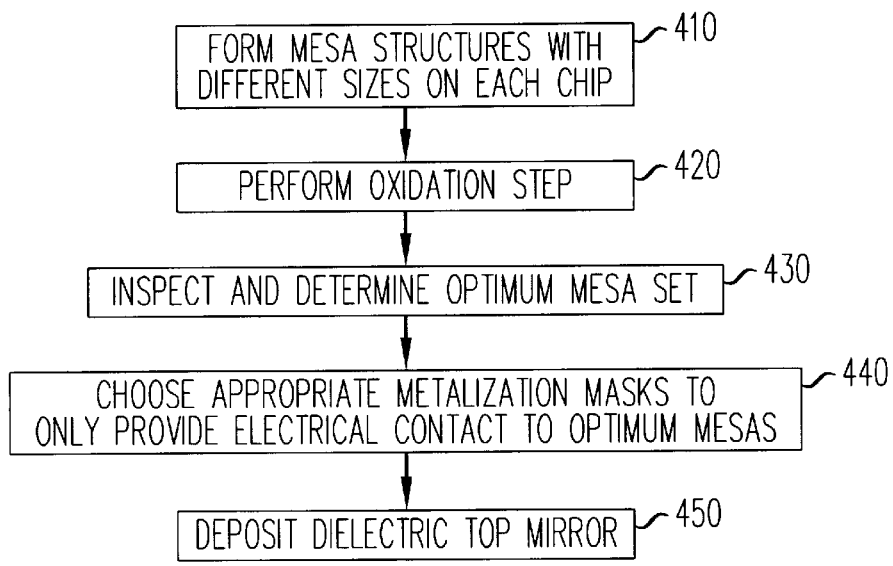
FIG. 4 is a flow diagram depicting our inventive method.

As is known to those skilled in the manufacture of oxide-apertured vertical cavity surface emitting lasers, the size of the oxide-aperture greatly influences the operational characteristics of the laser. Also, and as noted previously, the rate of oxidation is variable, and is generally uncontrollable. Consequently, and with reference now to FIG. 4, a series of devices 301(*a*)–301(*h*), each having a different sized oxide layer mesa may be formed on a single chip 300. Prior to including the mirrors with the devices, an inspection is made of the chip to determine which individual device from the series of devices 301(*l*)–301(*h*) is optimal, or most desired, for laser operation and performance. Subsequent to this determination, only that device exhibiting the desired oxide-aperture characteristic (301(*f*) in this FIG.) is provided with electrical contacts 310. Accordingly, this simplifies subsequent packaging of the VCSEL chip since the desired VCSEL is row readily apparent to the packager.

As can be appreciated, our inventive method permits the manufacture of consistent VCSELs, each exhibiting a desired set of operational characteristics. A result of our method, is that ONLY the VCSEL exhibiting the desired oxide-aperture mesa characteristics is electrically connected and further processed. The less or undesired mesas within a chip are left unprocessed.

Figure 3:
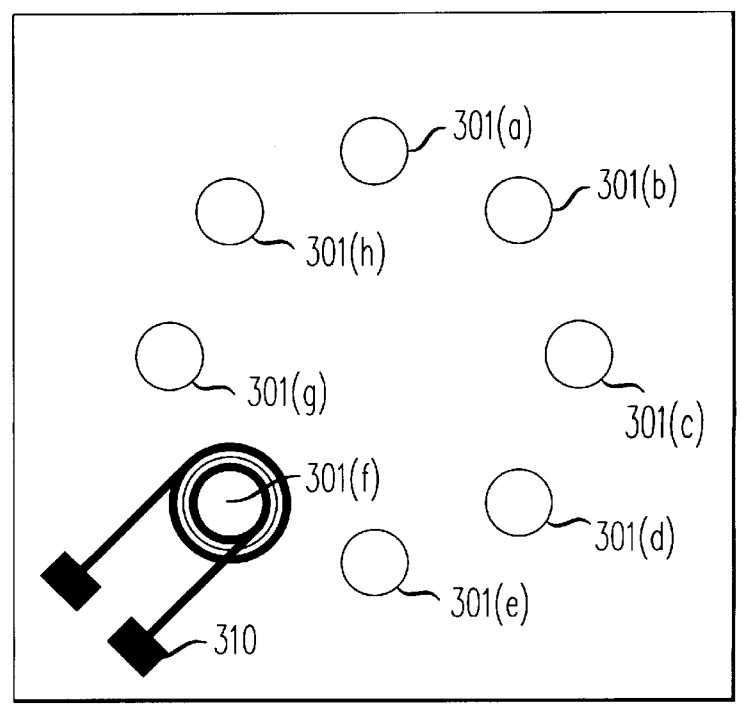
FIG. 3 is a top view of the VCSEL chip of FIG. 2 including multiple devices with different sized oxide layer mesas and only one device having electrical contacts.

Turning now to FIG. 3, there is shown a flow diagram depicting our inventive method for fabricating oxide-aperture VCSELs. Specifically, and as indicated by block 410, mesa structures of different sizes are formed on respective chips. Of course, while this step refers to the formation of an individual chip, it is to be understood that multiple chips may be simultaneously formed on a particular wafer. Likewise, multiple wafers may be produced in parallel.

Subsequent to the mesa formation, the oxide aperture is formed thereon (Block 420). As noted previously, the rate of oxidation is variable and is generally considered uncontrollable to a desired amount. Consequently, variations in oxides from wafer to wafer is anticipated.

After oxidation, the chip(s) are inspected to determine which individual mesa having a particular oxide-aperture is desired or optimum for a particular application (block 430). Once this determination is made, an appropriate metalization mask may be chosen (block 440) such that ONLY those mesas deemed appropriate in block 430 will have electrical contacts made thereto. Finally, dielectric mirrors are disposed (block 450) on those mesas having electrical contacts.

Of course, while the discussion has been limited so far to a single chip, our invention is not so restricted. In particular, and with reference now to FIG. 5 there is shown a single wafer 500 having multiple chips 501(1), 501(2), 501(3) . . . 501(*n*) disposed thereon, with each chip having a plurality of different sized mesas 510(1)$_a$, 510(1)$_b$, 510(1)$_c$, 510(1)$_d$, . . . 510(*n*)$_a$, 510(*n*)$_b$, 510(*n*)$_c$, 510(*n*)$_d$, where n is the number of individual chips on the wafer and a-d represent the individual mesas on an individual chip. Generally, each corresponding mesa on an individual chip is the same size from chip to chip. In particular mesa a is the same size on each of the chips in a particular wafer.

Figure 6:
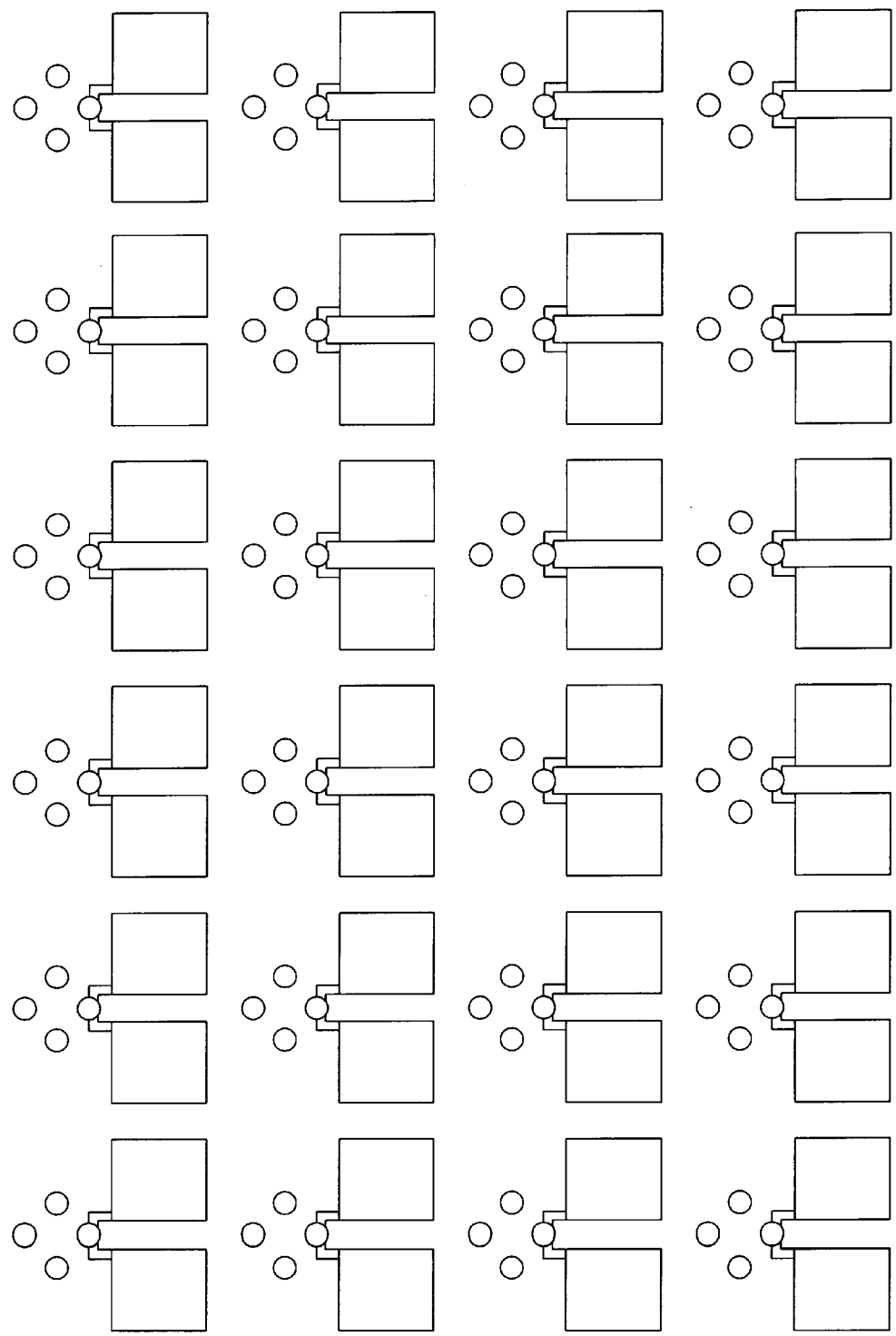
FIG. 6 is a top view of the VCSEL wafer of FIG. 5 in which mesa #3 has been identified as desirable and has wire pads attached.
Figure 7:
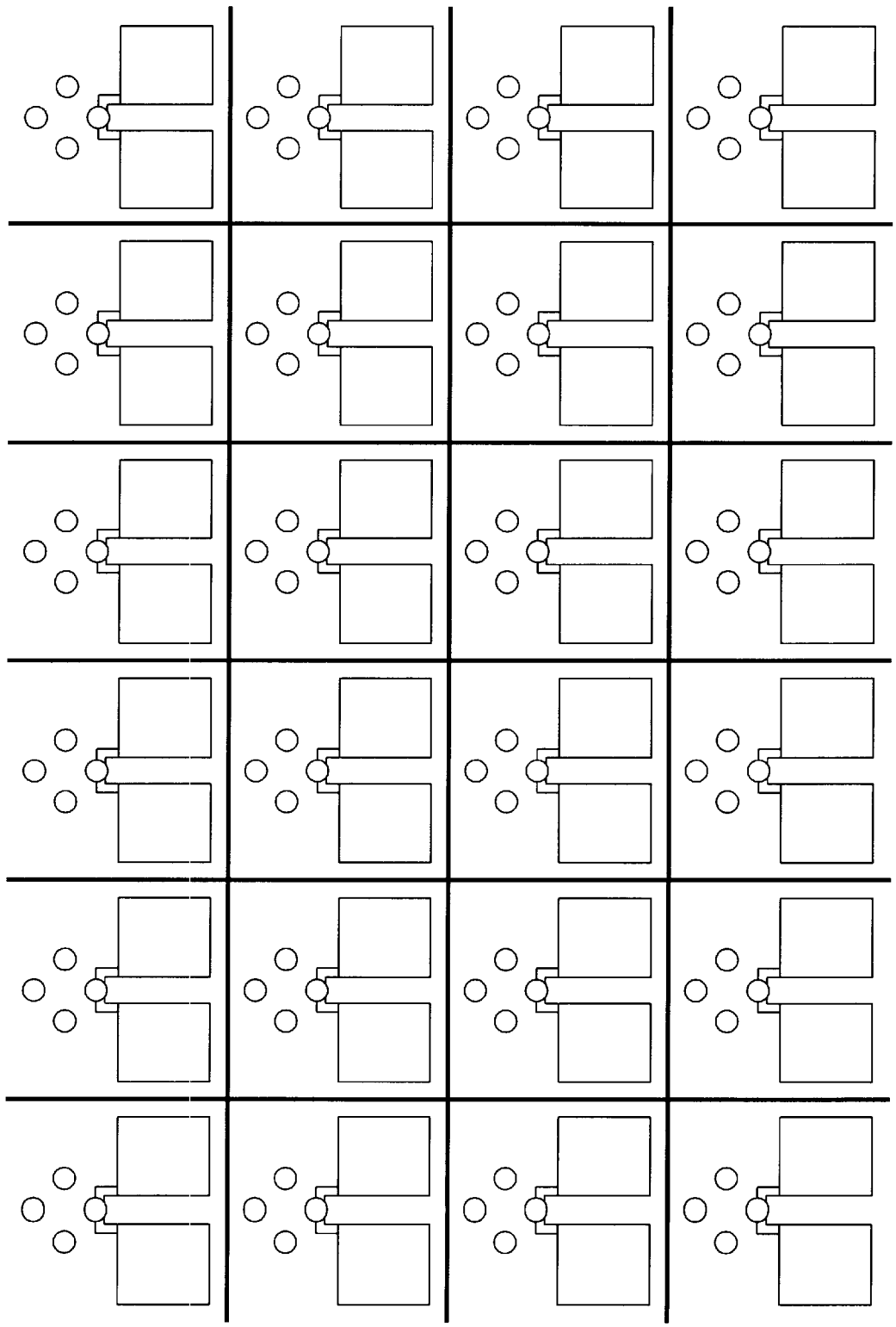
FIG. 7 is a top view of the VCSEL wafer of FIG. 6 in which dicing lanes have been applied according to selected mesa.
Figure 8:
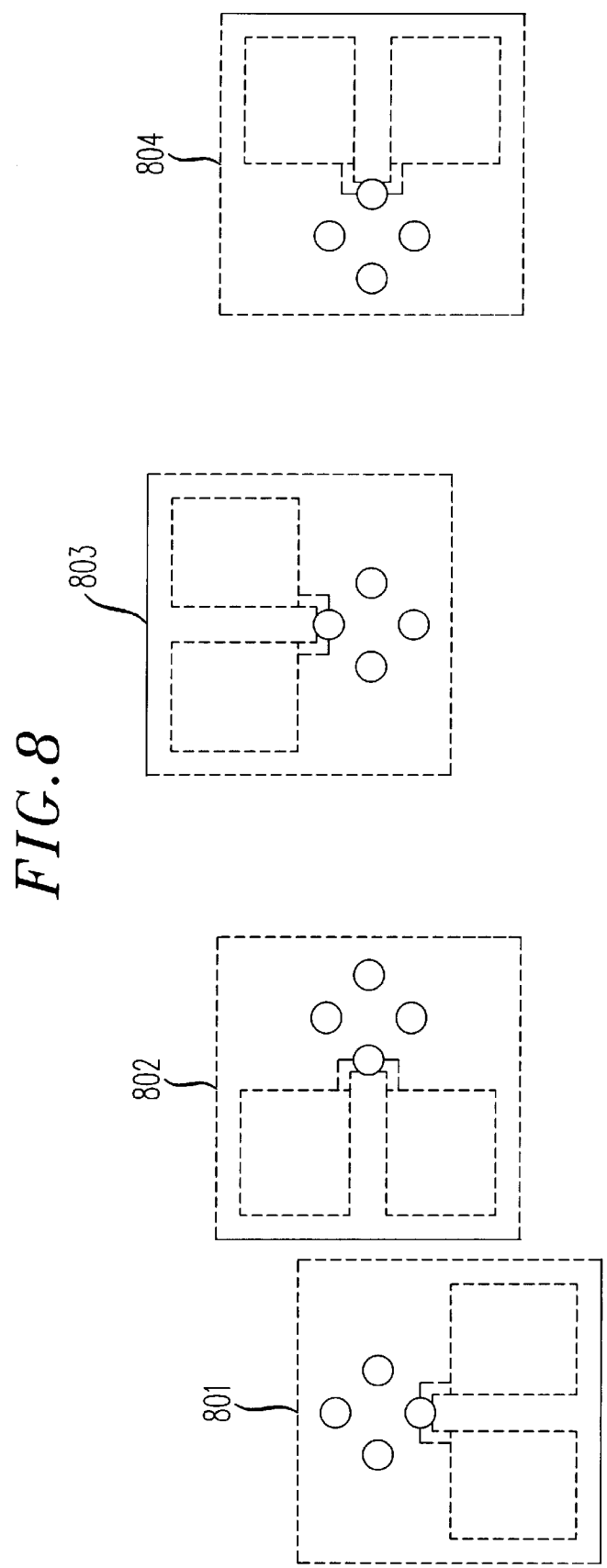
FIG. 8 is a schematic top view showing the wire-bond orientation for each respective mesa on a chip.

Once the mesas are formed, they are inspected to determine which mesa size is appropriate or optimal. With reference now to FIG. 6, once the particular mesa on an individual chip is determined, electrical contacts are made to that particular mesa on each individual chip. Subsequently, and with reference now to FIG. 7, dicing lanes are formed on the wafer so that individual chips may separated from one another, Finally, with reference now to FIG. 8, there is shown individual chips 801, 802, 803 and 804 each depicting different individual mesas electrically connected.

Using four mesas per chip allows the appropriate or optimal mesa to exhibit the same geometric or physical relationship with respect to the sides of the chip and the wire pads. Consequently, identical packaging may be employed regardless of which mesa is determined to be appropriate or optimal.

At this point, it should be apparent to those skilled in the art that our inventive method permits the final fabrication of ONLY those devices that will exhibit the desired set of laser characteristics as determined by the oxide-aperture.

Various additional modifications of this invention will occur to those skilled in the art. Consequently, all deviations from the specific teachings of this specification that basically rely upon the principles and their equivalents through which the art has been advanced are properly considered within the scope of the invention as described and claimed.

The invention claimed is:

1. A method of fabricating oxide-aperture vertical-cavity surface-emitting lasers, the method comprising the steps of:

forming a plurality of mesas of different sizes on a semiconductive chip;

oxidizing the chip such that an oxide-aperture is formed on each one of the mesas;

inspecting the oxidized chip to determine a desired mesa from the plurality of mesas;

masking the chip with an appropriate metalization mask such that only the desired mesa is provided with electrical contacts; and depositing a dielectric mirror on the desired mesa such that only the desired mesa is completely fabricated.

2. The method according to claim 1 wherein the chip is one of a plurality of chips formed on a single semiconductive wafer such that each individual chip has a desired mesa that corresponds to a desired mesa on each of the other chips.

3. The method according to claim 2 wherein four (4) mesas are formed on each chip such that each one of the four mesas exhibits an identical positioning relationship relative to the sides of the chip nearest to any particular mesa.

* * * * *